(12) United States Patent
Hayashi et al.

(10) Patent No.: US 7,531,396 B2
(45) Date of Patent: May 12, 2009

(54) METHOD OF MANUFACTURING SEMICONDUCTOR DEVICE

(75) Inventors: Tetsuya Hayashi, Yokosuka (JP); Masakatsu Hoshi, Yokohama (JP); Yoshio Shimoida, Yokosuka (JP); Hideaki Tanaka, Yokohama (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 472 days.

(21) Appl. No.: 11/374,418

(22) Filed: Mar. 14, 2006

(65) Prior Publication Data
US 2007/0218596 A1  Sep. 20, 2007

(51) Int. Cl.
*H01L 21/338* (2006.01)
*H01L 21/066* (2006.01)

(52) U.S. Cl. ...................... 438/172; 438/285
(58) Field of Classification Search ................ 438/105, 438/285, 590
See application file for complete search history.

(56) References Cited

U.S. PATENT DOCUMENTS

| 5,977,564 | A | 11/1999 | Kobayashi et al. |
| 6,002,143 | A * | 12/1999 | Terasawa ..................... 257/77 |
| 2006/0068537 | A1 * | 3/2006 | Hayashi et al. ............. 438/197 |

FOREIGN PATENT DOCUMENTS

| JP | 2003-318398 | 11/2003 |
| JP | 2003-318398 A | 11/2003 |
| JP | 2005-259796 A | 9/2005 |

OTHER PUBLICATIONS

Takemura et al.; "Implantation of Al and B Acceptors into Alpha-SiC and pn Junction Diodes"; *Materials Science Forum*:c. 1998; vol. 264-268; pp. 701-704; Trans Tech Publications; Switzerland.
Hayashi et al., US PTO Notice of Allowance and Fee(s) Due, U.S. Appl. No. 11/321,799, Sep. 8, 2008, 4 pages.
Hayashi et al., US PTO Office Action, U.S. Appl. No. 11/231,799, Apr. 4, 2008, 8 pages.
Takemura et al., "Implantation of Al and B Acceptors into Alpha-SiC and pn Junction Diodes," *Materials Science Forum*, c. 1998, vol. 264-268, pp. 701-704; Trans Tech Publications; Switzerland.

* cited by examiner

*Primary Examiner*—Calvin Lee
(74) *Attorney, Agent, or Firm*—Foley & Lardner LLP

(57) ABSTRACT

A method of manufacturing a semiconductor device is disclosed. The semiconductor device includes a semiconductor body of a first conductivity type, a hetero semiconductor region adjacent to one main surface of the semiconductor body and having a band gap different from that of the semiconductor body, and a gate electrode formed in a junction portion between the hetero semiconductor region and the semiconductor body through a gate insulating film. The method includes a first process of forming a predetermined trench by using a mask layer having a predetermined opening on one main surface side of the semiconductor body, a second process of forming a buried region adjacent to at least a side wall of the trench and so as to extend from the trench, a third process of forming a hetero semiconductor layer so as to adjoin the semiconductor body and the buried region, and a fourth process of forming the hetero semiconductor region by patterning the hetero semiconductor layer.

11 Claims, 8 Drawing Sheets

METHOD OF MANUFACTURING SEMICONDUCTOR DEVICE

BACKGROUND OF THE INVENTION

The present invention relates to a method of manufacturing a semiconductor device.

As the related art which is the background of the present invention, Japanese Patent Application Publication No. 2003-318398 filed by the applicant of the present invention has been disclosed. In this related art, an N⁻ type polycrystalline silicon region and an N⁺ type polycrystalline silicon region are formed so as to adjoin each other on one main surface of a semiconductor body in which an N⁻ type silicon carbide epitaxial region is formed on an N⁺ type silicon carbide substrate, in addition, the epitaxial region, the N⁻ type polycrystalline silicon region and the N⁺ type polycrystalline silicon region forms a hetero junction. Furthermore, a gate electrode is formed so as to be adjacent to a junction portion between the epitaxial layer, and the N⁺ type polycrystalline silicon region while interposing a gate insulating film therebetween. The N⁻ type polycrystalline silicon region is connected to a source electrode, and a drain electrode is formed on a backside surface of the N⁺ type silicon carbide substrate.

The semiconductor device of the related art having the structure as described above functions as a switching device by controlling an electric potential of the gate electrode in a state where the source electrode is grounded and a predetermined positive electric potential is applied to the drain electrode. That is, in the state where the gate electrode is grounded, reverse bias is applied to the hetero junction formed of the N⁻ type polycrystalline silicon region, the N⁺ type polycrystalline silicon region and the epitaxial region so that no current flows between the drain electrode and the source electrode. However, in the state where the predetermined positive voltage is applied to the gate electrode, gate electric filed acts on a hetero junction interface between the N⁺ type polycrystalline silicon region and the epitaxial region, and an energy barrier formed by the hetero junction surface on a gate oxide film interface is made to be thin. Therefore, current flows between the drain electrode and the source electrode. In this related art, since the hetero junction portion is used as a control channel for cutting-off and flowing of the current, the device functions with a channel length having a thickness equal to that of the hetero barrier. Therefore, a conduction characteristic of low resistance can be obtained.

SUMMARY OF THE INVENTION

However, in the related art, driving force is lowered because damages are caused on an etching surface of the silicon carbide epitaxial region when a physical etching such as a dry etching is used at the time of patterning the polycrystalline silicon region formed on the silicon carbide epitaxial region to form a channel interface between the polycrystalline silicon region and the silicon carbide epitaxial region.

The present invention has been made to solve the above problems of the related art. Accordingly, it is an object of the present invention to provide a method of manufacturing a semiconductor device capable of suppressing decrease of the driving force.

To achieve the above objective, in the method of manufacturing a semiconductor device including a hetero semiconductor region adjacent to one main surface of a semiconductor body of a first conductivity type, which has a band gap different from that of the semiconductor body; a gate electrode formed in a junction portion between the hetero semiconductor region and the semiconductor body through a gate insulating film, a source electrode connected to the hetero semiconductor region, and a drain electrode having an ohmic connection with the semiconductor body, the method of manufacturing the semiconductor device includes the processes of forming a predetermined trench on the main surface side of the semiconductor body by using a mask layer having a predetermined opening, forming a buried region adjacent to at least a side wall of the trench so as to be extended from the trench, forming a hetero semiconductor layer so as to adjoin the semiconductor body and the buried region, and forming the hetero semiconductor region by patterning the hetero semiconductor layer.

DETAILED DESCRIPTION OF THE PREFERRED EMBODIMENTS

Detailed description of preferred embodiments of the present invention will be given below by referring to the accompanying drawings. It should be noted that the same reference numerals are used in the following drawings among the components having same function, and the same description is not repeated.

First Embodiment (Structure)

Figure 1:
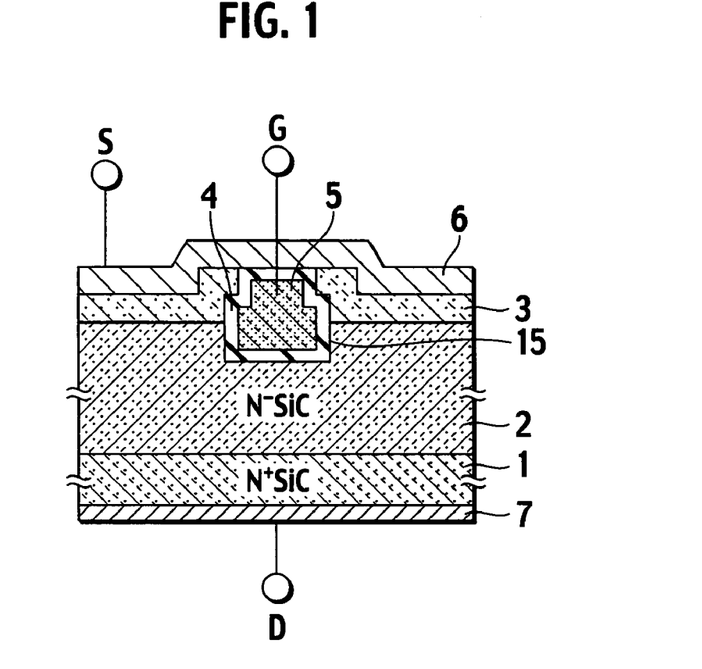
FIG. 1 is a cross sectional diagram showing a semiconductor device according to a first embodiment of the present invention.

FIG. 1 shows a first embodiment of a semiconductor device according to the present invention. FIG. 1 is a cross sectional diagram of two structural unit cells facing each other. In the present embodiment, the description is given as one example by using a semiconductor device whose substrate material is silicon carbide (SiC).

For example, a drain region 2 formed of an N⁻ type silicon carbide epitaxial layer is formed on a substrate 1 formed of N⁺ type silicon carbide in which polytype is 4H and a hetero semiconductor region 3 formed of, for example, N type polycrystalline silicon is formed so as to adjoin a main surface of the drain region 2 opposing to a junction surface with the substrate 1. That is, the junction portion between the drain region 2 and the hetero semiconductor region 3 is composed of a hetero junction formed of materials of silicon carbide and polycrystalline silicon which are different in a band gap, and an energy barrier is present on a junction interface thereof. A gate insulating film 4 formed of, for example, a silicon oxide film is formed so as to adjoin the junction portion between the hetero semiconductor region 3 and the drain region 2. In addition, a gate electrode 5 is formed on the gate insulating film 4, and a source electrode 6 is formed on the surface of the hetero semiconductor region 3 opposite to the junction surface between the hetero semiconductor region 3 and the drain region 2, and a drain electrode 7 is formed on the substrate 1 so as to be connected to the substrate 1. In the present embodiment, as shown in FIG. 1, a trench 15 is formed in the drain region 2 so that a trench type structure in which the gate electrode 5 is buried is obtained.

(Manufacturing Method)

A method of manufacturing a silicon carbide semiconductor device according to the first embodiment of the present invention shown in FIG. 1 will now be described by referring to FIGS. 2A to 2H.

Figure 2A:
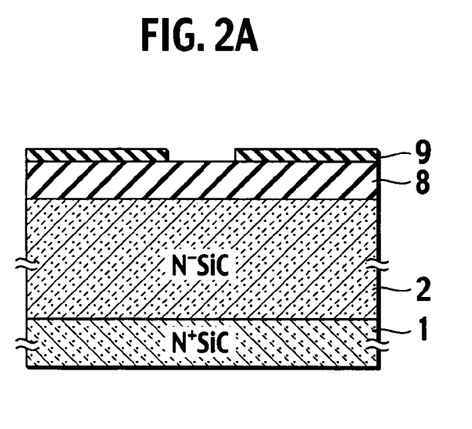
FIGS. 2A to 2H are cross sectional diagrams showing a method of manufacturing a silicon carbide semiconductor device according to the first embodiment of the present invention shown in FIG. 1.

First, as shown in FIG. 2A, a nitride silicon film is deposited on an N type silicon carbide semiconductor body formed by epitaxialy growing the N⁻ type drain region 2 on the N⁺ type silicon carbide substrate 1. The silicon nitride film serves as an antioxidant film (mask layer) 8 and is formed by, for example, a Low Pressure-Chemical Vapor Deposition (LP-CVD) method. Further, a mask layer 9 having a predetermined opening is formed on the antioxidant film 8 formed of the nitride silicon film by photolithography and etching.

Figure 2B:
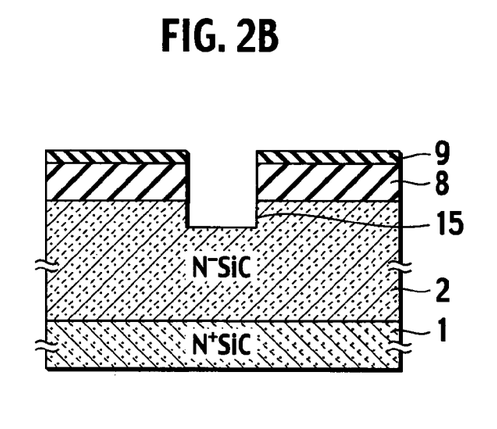

As shown in FIG. 2B, by using the mask layer 9 as a mask, the antioxidant film 8 and a surface layer portion of the drain region 2 are etched by using, for example, reactive ion etching (dry etching), and the drain region 2 is etched by a predetermined depth so that a trench 15 is formed. It should be noted that as a method of etching the antioxidant film 8 formed of the nitride silicon film and the drain region 2, other method may be used as long as it is an anisotropic etching.

Figure 2C:
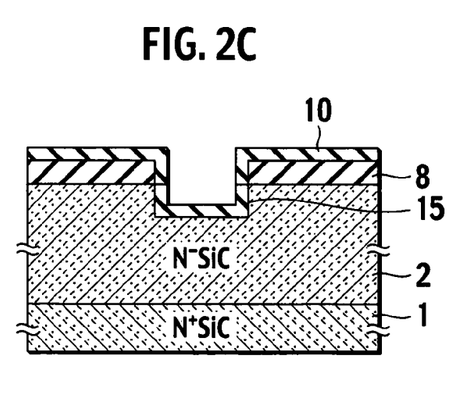

As shown in FIG. 2C, since etching damages are caused in the etched drain region 2 by dry etching, sacrificial oxidation is carried out by, for example, dry $O_2$ oxidation at 1100° C. to remove the damages, thus forming a sacrificial oxide film 10. At this time, in the present embodiment, since the nitride silicon film is formed by the LP-CVD method to be used as the antioxidant film 8, an oxidation rate thereof is relatively close to that of the drain region 2 formed of silicon carbide. Therefore, the sacrificial oxide film 10 at the same level is formed also on the antioxidant film 8 of the nitride silicon film. Thus, an upper end portion of the side wall of the drain region 2 and an end portion of the antioxidant film 8 can be kept to be flush. It should be noted that as a method of forming the sacrificial oxide film 10, the oxidation using the dry $O_2$ oxidation is given as one example, but any method may be used as long as the region damaged by etching in the drain region 2 can be buried into the oxide film.

Figure 2D:
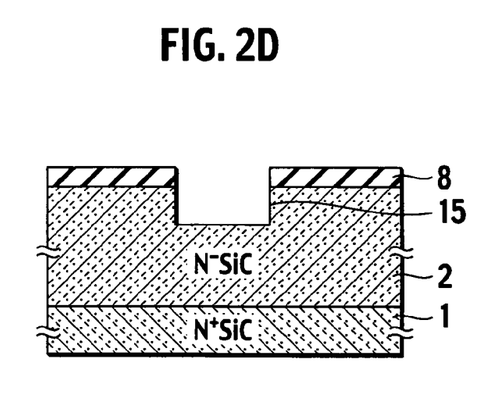

As shown in FIG. 2D, the sacrificial oxide film 10 (FIG. 2C) is removed by wet etching by use of a mixed solution of, for example, ammonium fluoride and hydrofluoric acid.

Figure 2E:
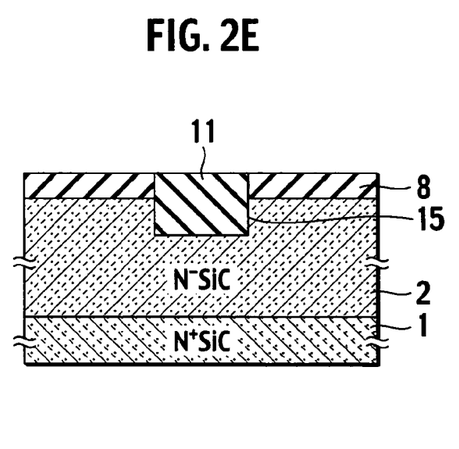

As shown in FIG. 2E, a buried region 11 is formed by using a reflowable material such as Spin-On-Glass (SOG). In the present embodiment, there is shown a case where the buried region 11 is formed so as to be substantially flush with the upper end portion of the trench 15 while including the trench in the antioxidant film 8. However, as long as the trench 15 is formed so as to adjoin at least the junction interface between the drain region 2 and the antioxidant film 8, there is no problem in that it is not completely buried, or extended from the trench to the outside. In addition, at the time of forming the buried region 11, a material for the buried region may also be formed on the antioxidant film 8, and then the buried region is formed by etchback.

Figure 2F:
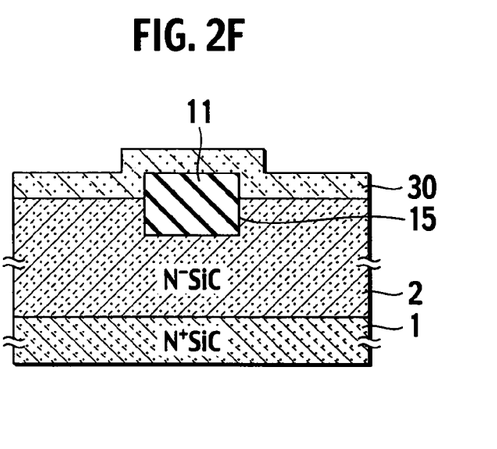

As shown in FIG. 2F, after the antioxidant film 8 formed of nitride silicon is removed by, for example, a phosphate solution, polycrystalline silicon is deposited by, for example, the LP-CVD method. After that, phosphorus doping is carried out in the atmosphere of, for example, phosphoryl chloride ($POCl_3$) so that a hetero semiconductor layer 30 formed of N type polycrystalline silicon is formed. It should be noted that this polycrystalline silicon layer may be formed by laser annealing, or the like to recrystallize it after being deposited by the electronic beam evaporation method or the sputtering method, or may be formed of single crystalline silicon of hetero epitaxial growth by, for example, the molecular beam epitaxy. In addition, for the doping of the polycrystalline silicon layer, a combination of ionic implantation and activation heat treatment after the ionic implantation may be used.

Figure 2G:
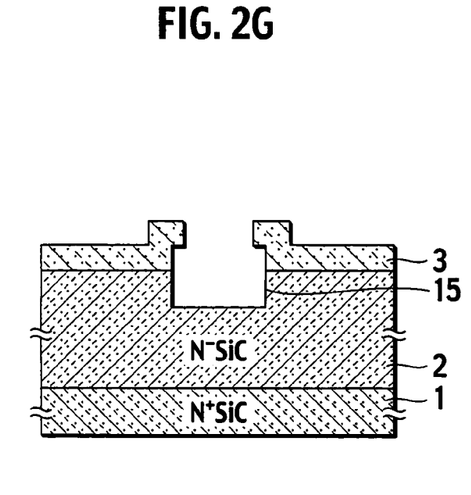

As shown in FIG. 2G, a mask layer (not shown) having a predetermined opening is formed in a predetermined region of the hetero semiconductor layer 30 of polycrystalline silicon by the photolithography and the etching, and one portion of the hetero semiconductor layer 30 is etched by, for example, reactive ion etching (dry etching) so that a hetero semiconductor region 3 is formed. Then, for example, the buried region 11 (FIG. 2F) formed of oxide is subjected to wet etching by a mixed solution of, for example, ammonium fluoride and hydrofluoric acid.

Figure 2H:
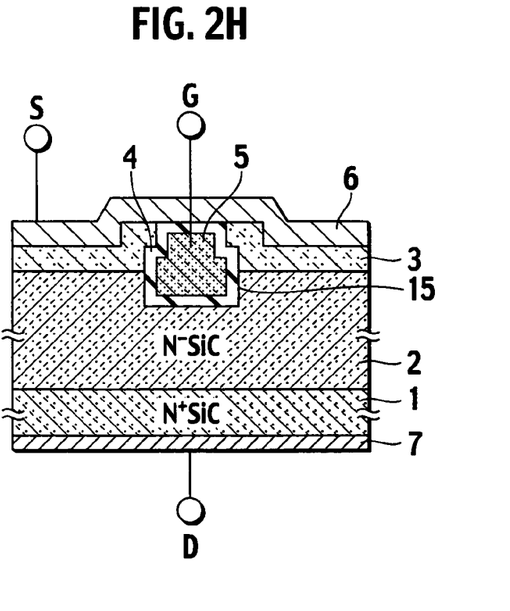

Lastly, as shown in FIG. 2H, a gate insulating film 4 is deposited along the inner wall of the hetero semiconductor region 3 and the drain region 2. Further, a polycrystalline silicon layer to be a gate electrode 5 is deposited. After that, phosphorus is doped into the polycrystalline silicon layer to be the gate electrode 5 by solid phase diffusion using $POCl_3$. After that, the gate electrode 5 is formed by the photolithography, etching, or the like before a drain electrode 7 formed of, for example, titanium (Ti) and nickel (Ni) is formed on the substrate 1 corresponding to a backside surface of the semiconductor device, and a source electrode 6 (insulated from the gate electrode 5 by the insulating film) formed by sequentially depositing titanium (Ti) and nickel (Ni) is formed in the hetero semiconductor region 3 corresponding to a front surface of the semiconductor device. Thus, the silicon carbide semiconductor device according to the first embodiment of the present invention shown in FIG. 1 is completed. It should be noted that, in the present embodiment, the case where the gate electrode 5 is buried in the trench is given as one example, but it may be formed so as to extend onto the hetero semiconductor region 3 through the gate insulating film 4. In addition, there is given one example that the neighboring regions are connected each other in such a manner that the source electrode 6 covers the gate electrode through the insulating film, but they do not have to be connected.

As described above, the present embodiment has a structure where, in a method of manufacturing a semiconductor device including a semiconductor body of a first conductivity type (a substrate 1 and a drain region 2), a hetero semiconductor region 3 adjacent to one main surface of the semiconductor body and having a band gap different from that of the semiconductor body, a gate electrode 5 formed in a junction portion between the hetero semiconductor region 3 and the semiconductor body through a gate insulating film 4, a source electrode 6 connected to the hetero semiconductor region 3, and a drain electrode 7 having an ohmic connection with the semiconductor body, the method of manufacturing the semiconductor device includes at least a first process of forming a predetermined trench 15 on the main surface side of the semiconductor body by using a mask layer 9 having a predetermined opening, a second process of forming a buried region 11 so as to adjoin at least a side wall of the trench 15 and extend from the trench 15, a third process of forming a hetero semiconductor layer 30 so as to adjoin the semiconductor body and the buried region 11, and a fourth process of forming the hetero semiconductor region 3 by patterning the hetero semiconductor layer 30.

With this structure, the semiconductor device according to the present embodiment can be easily obtained with an earlier manufacturing technique. In addition, with this manufacturing method, a structure in which an upper end portion of the trench 15 of the drain region 2 with etching damage removed comes to be a substantially flush with an end portion of the hetero semiconductor region 3 can be easily formed. With this, the gate electrode 5 can be formed through the gate insulating film 4 so as to oppose substantially perpendicular to a junction interface between the drain region 2 and the hetero semiconductor region 3. Therefore, an electric filed effectively expands to the hetero junction interface depending on a voltage applied to the gate electrode 5 and driving force during conduction is improved. In addition, by using a nitride silicon film as an antioxidant film 8, in the present embodiment in which the drain region 2 is formed of silicon carbide, the upper end portion of the trench 15 in the drain region 2 can be further easily formed to be substantially flush with the end portion of the hetero semiconductor region 3.

In addition, in the fourth process, the hetero semiconductor region 3 may be formed by etching back the hetero semiconductor layer 30. With this, the source electrode 6 can be formed on a flat surface so that reliability of the semiconductor device is improved.

As the buried region 11 is formed of a material which is removable after the third process, the manufacturing processes come to be easy. That is, a material which is easily etched by wet etching and has a relatively large selection ratio to the drain region 2 and the hetero semiconductor region 3 is used for the buried region 11. Therefore, the manufacturing processes come to be easy.

After the fourth process, a process of forming the gate insulating film 4 so as to adjoin the hetero interface between the hetero semiconductor region 3 and the semiconductor body is included. With this, it is possible to provide a hetero junction insulated gate field effect transistor with easy manufacturing processes.

Between the first process and the second process, a process of sacrificial oxidation is included. With this, a structure in which the upper end portion of the trench 15 in the drain region 2 comes to be substantially flush with the end portion of the hetero semiconductor region 3 while etching damages are removed can be easily formed. Thus, the gate electrode 5 can be formed through the gate insulating film 4 so as to oppose substantially perpendicular to the junction interface between the drain region 2 and the hetero semiconductor region 3. Therefore, an electric field effectively expands to the hetero junction interface depending on a voltage applied to the gate electrode 5 so that driving force during conduction is improved.

Meanwhile, the semiconductor body is formed of silicon carbide. With this, a semiconductor with a high break down voltage can be easily obtained by using a general semiconductor material.

Furthermore, the hetero semiconductor region 3 is formed of at least one of single crystalline silicon, polycrystalline silicon, and amorphous silicon. With this, a semiconductor device can be easily obtained by using a general semiconductor material.

In addition, the antioxidant film 8 of the mask layer is formed of a material having a similar value to that of a thermal oxidation rate of silicon carbide. With this, a sacrificial oxide film 10 at the same level is formed also on the antioxidant film 8 of the nitride silicon film. Therefore, the upper end portion of the side wall of the drain region 2 and the end portion of the antioxidant film 8 can retain to be substantially flush with each other.

(Operations)

Next, operations will be described. In the present embodiment, for example, the source electrode 6 is grounded and a positive potential is applied to the drain electrode 7.

First, when the gate electrode 5 is, for example, grounded or is a negative potential, a shielding state is kept. It is because that energy barrier is formed to conduction electron on both sides of the hetero junction interface between the hetero semiconductor region 3 and the drain region 2.

Next, when a positive potential is applied to the gate electrode 5 so that the shielding state is changed to a conduction state, a gate electric field reaches the hetero junction interface in which the hetero semiconductor region 3 and the drain region 2 are adjacent through the gate insulating film 4. Therefore, an accumulation layer of conduction electron is formed in the hetero semiconductor region 3 and the drain region 2 that are in the vicinity of the gate electrode 5. That is, a potential on the side of the hetero semiconductor region 3 in the junction interface between the hetero semiconductor region 3 and drain region 2 that are in the vicinity of the gate electrode 5 is depressed, and the energy barrier on the drain region 2 side comes to be precipitous. Therefore, it is possible that the conduction electron conducts through the energy barriers. In this time, by using this manufacturing method, a structure in which the upper end portion of the trench 15 in the drain region 2 with the etching damages removed comes to be substantially flush with the end portion of the hetero semiconductor region 3 can be easily formed. With this, the gate electrode 5 can be formed through the gate insulating film 4 so as to oppose substantially perpendicular to the junction interface between the drain region 2 and the hetero semiconductor region 3. Therefore, the electric filed effectively expands to the hetero junction interface depending on a voltage applied to the gate electrode 5 so that high driving force can be obtained.

Next, when the gate electrode 5 is grounded again so as to change the conducting state to the shielding state, the accumulation state of the conduction electron formed in the hetero junction interface between the hetero semiconductor region 3 and the drain region 2 is relieved, and then tunneling in the energy barrier stops. Consequently, the flow of the conduction electron from the hetero semiconductor region 3 to the drain region 2 stops. Further, the conduction electron in the drain region 2 flows to the substrate 1, and when the conduction electron is depleted, a depletion layer expands from the hetero junction portion to the drain region 2 side, resulted in the shielding state.

In addition, in this structure, similar to the structure of earlier technique, reverse direction conduction (reflux operation) is possible in which, for example, the source electrode 6 is grounded and a negative potential is applied to the drain electrode 7.

For example, when the source electrode 6 and the gate electrode 5 are grounded and a predetermined electric potential is applied to the drain electrode 7, the energy barrier for the conduction electron disappears, and the conduction electron flows from the drain region 2 side to the hetero semiconductor region 3, resulted in a reverse conduction state. In this time, a positive hole is not infused, and conduction is carried out only by the conduction electron. Therefore, loss of the conduction electron due to reverse recovery current is small at the time of changing the reverse conduction state to the shielding state. It should be noted that a case where the above described gate electrode 5 is used as a control electrode without being grounded is also possible.

Figure 3:
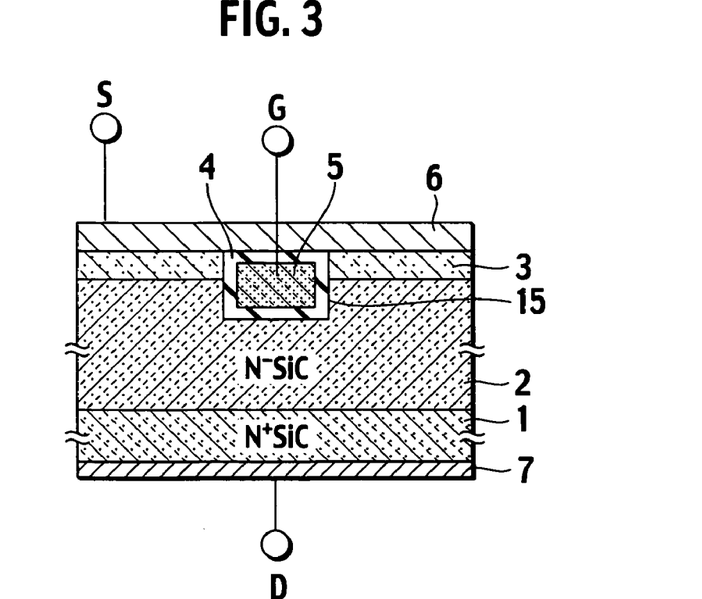
FIG. 3 is a cross sectional diagram showing a structure that is different from FIG. 1 in that a hetero semiconductor region 3 is flatly formed.

(Structure of FIG. 3)

A structure of FIG. 3 is different when compared with the structure of FIG. 1 in that a hetero semiconductor region 3 is flatly formed, a gate insulating film 4 is formed on a side wall of a trench 15, a gate electrode 5 is buried to be flat in the trench 15, and a source electrode 6 is flatly formed on a surface of an element.

Figure 4A:
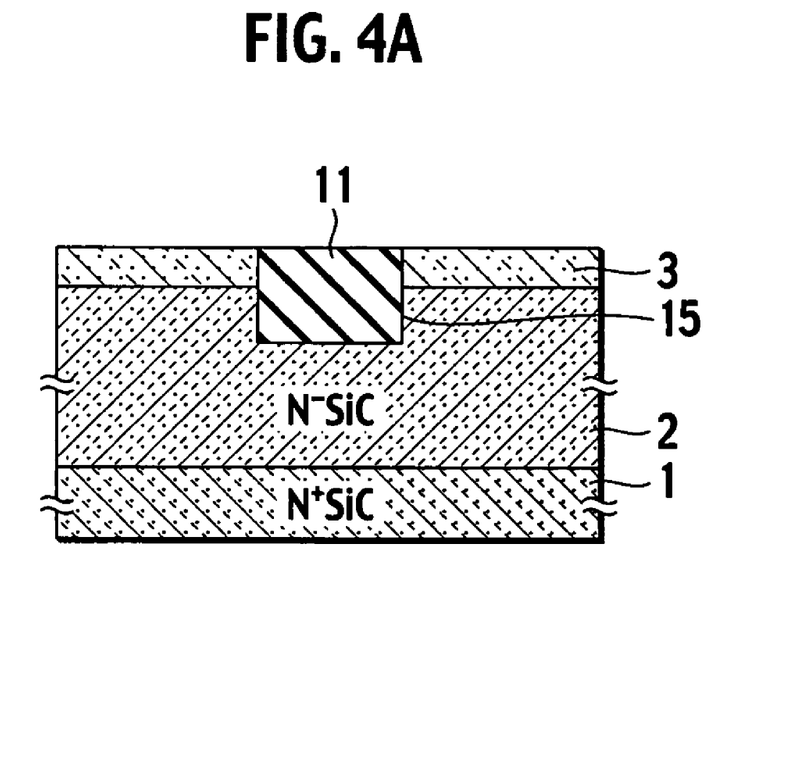
FIGS. 4A to 4B are cross sectional diagrams showing a method of manufacturing a semiconductor device shown in FIG. 3.

Next, a method of manufacturing a semiconductor device of silicon carbide having the structure shown in FIG. 3 will be described by referring to FIGS. 4A to 4B.

First, FIGS. 2A to 2F showing manufacturing processes of the structure of FIG. 1 have the same structure with that of FIG. 3. In the structure shown in FIG. 2F, the hetero semiconductor region 3 is processed to be flat by Chemical Mechanical Polishing (CMP), and as shown in FIG. 4A, a surface including the hetero semiconductor region 3 and a buried region 11 is flatly formed.

Figure 4B:
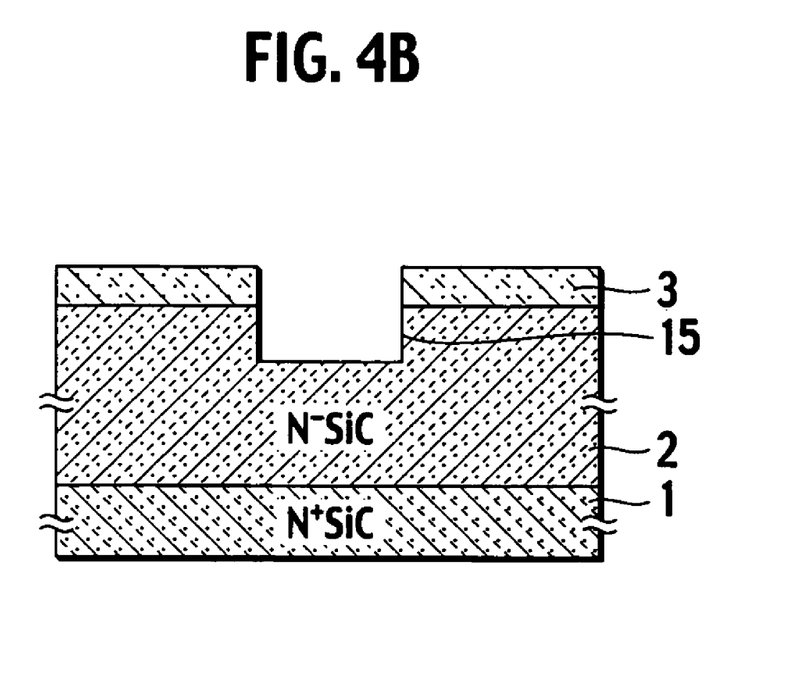

Next, for example, the buried region 11 formed of oxidant is subjected to wet etching by a mixed solution of, for example, ammonium fluoride and hydrofluoric acid so as to be a state shown in FIG. 4B.

Lastly, as shown in FIG. 3, similar to the structure of FIG. 1, a gate insulating film 4 is deposited along an inner wall of the hetero semiconductor region 3 and a drain region 2. Further, a polycrystal layer to be the gate electrode 5 is deposited. After that, phosphorus is doped into the polycrystalline silicon layer to be the gate electrode 5 by solid phase diffusion using $POCl_3$. Consequently, the gate electrode 5 is formed by the photolithography, etching, or the like before a drain electrode 7 formed of, for example, titanium (Ti) and nickel (Ni) is formed on a substrate 1 corresponding to a backside surface of the semiconductor device, and a source electrode 6 (insulated from the gate electrode 5 by the insulating film) formed by sequentially depositing titanium (Ti) and nickel (Ni) is formed in the hetero semiconductor region 3 corresponding to a front surface of the semiconductor device. Thus, the silicon carbide semiconductor device according to the structure of the present invention shown in FIG. 3 is completed. It should be noted that, also in the present embodiment, similar to FIG. 1, the case where the gate electrode 5 is buried in the trench is given as one example, but it may be formed through the gate insulating film 4 so as to extend onto the hetero semiconductor region 3. In addition, there is given one example that the neighboring regions are connected each other in such a manner that the source electrode 6 covers the gate electrode through the insulating film, but they do not have to be connected.

In this manner, in the fourth process of forming the hetero semiconductor region 3 by patterning the hetero semiconductor layer 30 (see, FIG. 2F), the hetero semiconductor region 3 is formed by carrying out Chemical Mechanical Polishing (CMP) for the hetero semiconductor layer 30. With this, in the manufacturing processes of the structure of FIG. 1, as shown in FIG. 2G, the processes can be simplified since it is not needed to form a mask layer (not shown) having a predetermined opening in a predetermined region on the hetero semiconductor layer 30 by photolithography and etching. In addition, the surface of the element can be flat, accordingly problems regarding reliability such as disconnection can be suppressed.

(Method of Manufacturing FIGS. 5A to 5F)

Next, referring now to FIGS. 5A to 5F, another manufacturing method according to the present embodiment will be described below. A completed structure is the same with that of FIG. 3.

Figure 5A:
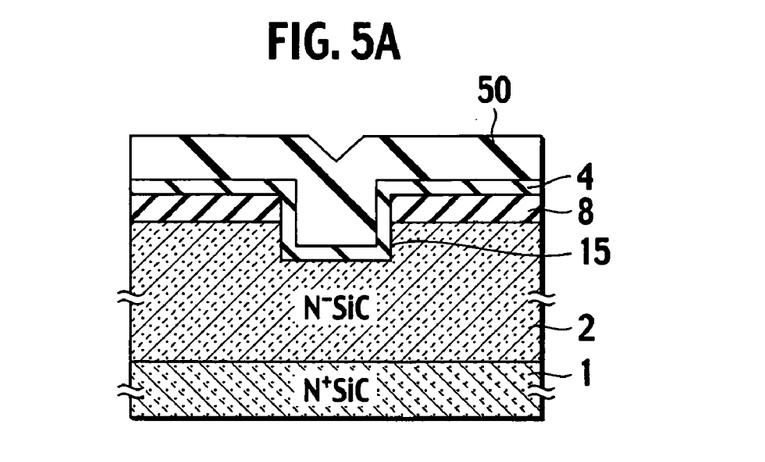
FIGS. 5A to 5F are cross sectional diagrams showing another method of manufacturing semiconductor device show in FIG. 3.

First, FIGS. 2A to 2D showing the method of manufacturing the structure of FIG. 1 have the same structure with that of FIG. 1. In the structure shown in FIG. 2D, as shown in FIG. 5A, an insulating film 4 is deposited along an inner wall of an antioxidant film (mask layer) 8 and a drain region 2. Further, a polycrystalline silicon layer 50 to be a gate electrode 5 is deposited. After that, phosphorus is doped into the polycrystalline silicon layer 50 to be the gate electrode 5 by solid phase diffusion using $POCl_3$.

Figure 5B:
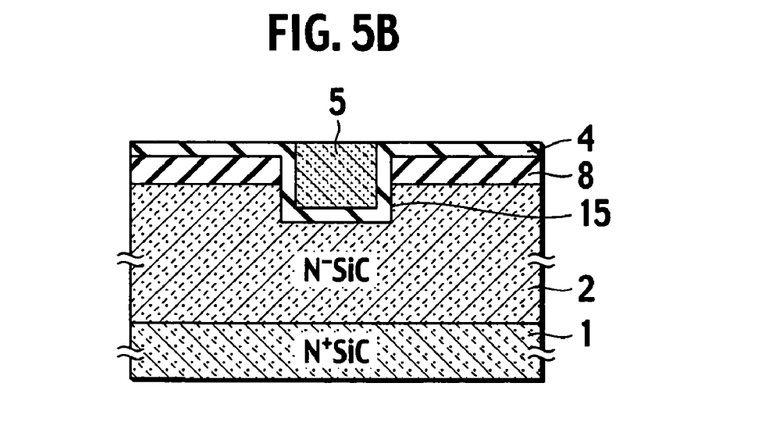

Next, the polycrystalline silicon layer 50 is etched back to be a state shown in FIG. 5B so that the gate electrode 5 is formed.

Figure 5C:
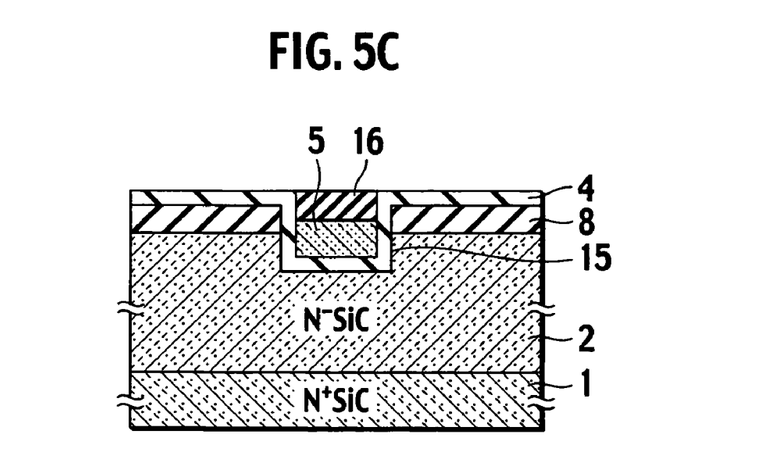

As shown in FIG. 5C, a cap oxide film 16 is formed in an upper portion of the gate electrode 5 by thermal oxidation.

Figure 5D:
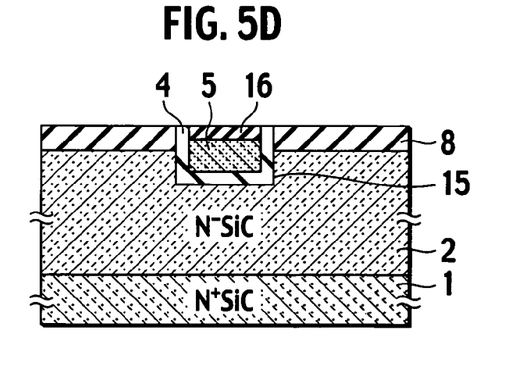

As shown in FIG. 5D, upper portions of the gate insulating film 4 and the cap oxide film 16 on the antioxidant film 8 are removed by dry etching.

Figure 5E:
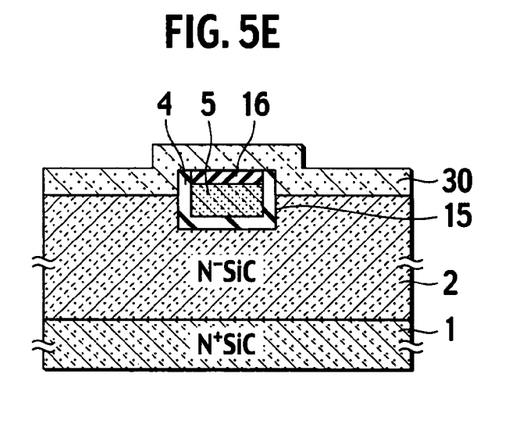

As shown in FIG. 5E, the antioxidant film 8 formed of silicon nitride is removed by, for example, phosphoric acid solution before polycrystalline silicon is deposited by, for example, the LP-CVD method. After that, phosphorus doping is carried out in the atmosphere of, for example, $POCl_3$ so that a hetero semiconductor layer 30 formed of an N⁻type polycrystalline silicon is formed. It should be noted that this polycrystalline silicon layer may be formed by laser annealing to recrystallize it after being deposited by the electronic beam evaporation method or the sputtering method, or may be formed of single crystalline silicon of the hetero epitaxial growth by, for example, the molecular beam epitaxy. In addition, for the doping of the polycrystalline silicon layer, a combination of ionic implantation and activation heat treatment after the ionic implantation may be used.

Figure 5F:
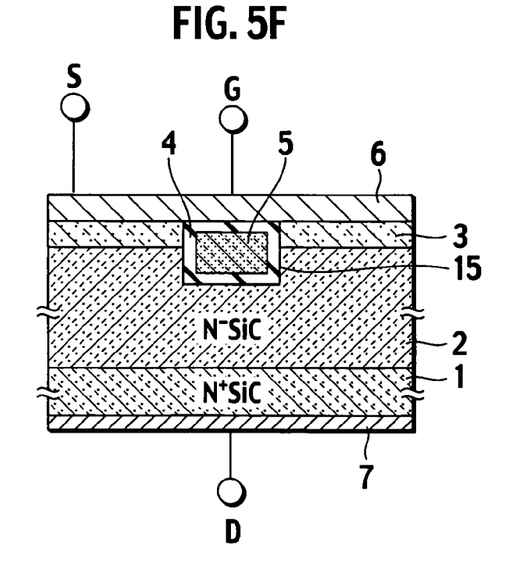

Lastly, similar to the structure of FIG. 4, as shown in FIG. 5F, the hetero semiconductor region 3 is processed to be flat by Chemical Mechanical Polishing, a drain electrode 7 formed of, for example, titanium (Ti) and nickel (Ni) is formed on a substrate 1 corresponding to a backside surface of the semiconductor device, and a source electrode 6 is formed by sequentially depositing titanium (Ti) and aluminum (Al) in the hetero semiconductor region 3 corresponding to a front surface of the semiconductor device. Thus, the silicon carbide semiconductor device according to the structure of the present invention shown in FIG. 3 is completed.

As described above, the present embodiment has a structure where, in a method of manufacturing the semiconductor device including the semiconductor body of a first conductivity type (the substrate 1 and the drain region 2), the hetero semiconductor region 3 adjacent to the one main surface of the semiconductor body and having a band gap different from that of the semiconductor body, the gate electrode 5 formed in the junction portion between the hetero semiconductor region 3 and the semiconductor body through the gate insulating film 4, the source electrode 6 connected to the hetero semiconductor region 3, and the drain electrode 7 having the ohmic connection with the semiconductor body, the method of manufacturing the semiconductor device includes at least a first process of forming the predetermined trench 15 on the main surface side of the semiconductor body by using the mask layer having a predetermined opening, a second process of forming the gate insulating film 4 so as to adjoin at least the side wall of the trench 15, a third process of forming the gate electrode 5 adjacent to the gate insulating film 4, a fourth process of forming the hetero semiconductor layer 30 on the gate electrode 5 through the cap oxide film 16 which is an interlayer insulating film, and a fifth process of forming the hetero semiconductor region 3 by patterning the hetero semiconductor layer 30.

With this structure, the semiconductor device according to the present embodiment can be easily obtained with a conventional manufacturing technique. In addition, with this manufacturing method, a structure in which an upper end portion of the trench 15 of the drain region 2 with etching damages removed comes to be substantially flush with an end portion of the hetero semiconductor region 3 can be easily formed. With this, the gate electrode 5 can be formed through the gate insulating film 4 so as to oppose substantially perpendicular to the junction interface between the drain region 2 and the hetero semiconductor region 3. Therefore, an electric filed effectively expands to the hetero junction interface depending on a voltage applied to the gate electrode 5 so that driving force during conduction is improved. In addition, by using a silicon nitride film as the antioxidant film 8, in the present embodiment in which the drain region 2 is formed of silicon carbide, the upper end portion of the trench 15 in the drain region 2 can be further easily formed to be substantially flush with the end portion of the hetero semiconductor region 3.

In addition, the gate insulating film 4 includes at least a thermal oxide film formed by thermal oxidation. With this, a quality gate insulating film can be easily formed so that improvement of driving force during the conducting state can be expected and high reliability can be obtained.

It should be noted that the present invention has been described by using the structures shown in FIGS. 1 and 3 as one example, but it can be applied to, for example, the structures shown in FIGS. 6 to 9.

Figure 6:
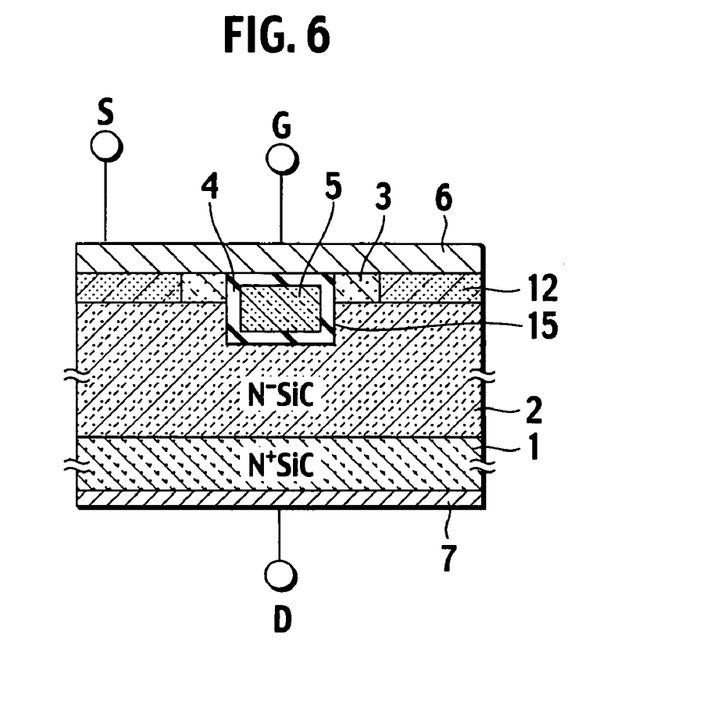
FIG. 6 is a cross sectional diagram showing a structure that is different from FIG. 1 in that a hetero semiconductor region 3 (N⁻type polycrystalline silicon) and a second hetero semiconductor region 12 (P⁻type polycrystalline silicon) are formed.

(Structure of FIG. 6)

A structure of FIG. 6 is different from that of FIG. 1 in that a hetero semiconductor region 3 formed of, for example, N⁻type polycrystalline silicon and a second hetero semiconductor region 12 formed of P⁻type polycrystalline silicon are formed so as to adjoin a main surface opposing to a junction surface between a drain region 2 and a substrate 1. That is, the junction portion of the drain 2, the hetero semiconductor region 3, and the second hetero semiconductor regions 12 has a hetero junction by materials having different band gap from that of SiC and polycrystal, and energy barriers are formed in the junction interface thereof. A gate insulating film 4 formed of, for example, a silicon oxide film is formed so as to adjoin the junction portion between the hetero semiconductor region 3 and the drain region 2. In addition, a gate electrode 5 is formed to be connected to the gate insulating film 4, a source electrode 6 is connected on an opposite surface opposing to the junction surface of the drain region 2 with the hetero semiconductor region 3 and the second hetero semiconductor region 12, and a drain electrode 7 is connected on the substrate 1.

In a method of manufacturing the structure of FIG. 6, the hetero semiconductor region 3 is formed before P⁻type impurity of reverse conductivity type that is, for example, a reverse conductivity type of the N⁻type hetero semiconductor region 3 is introduced into a predetermined portion (second hetero semiconductor regions 12) in the hetero semiconductor region 3. Thus, a conductivity type and impurity concentration of the hetero semiconductor region can be freely designed.

Next, operations of this structure will be described. In essence, the structure is similar to that of FIG. 1, but with such a structure, shielding performance will be further improved. It is because that an energy barrier for conduction electron is formed in both sides of the junction interface between the hetero semiconductor region 3 as well as the second hetero semiconductor region 12, and the drain region 2. In this time, both of the hetero semiconductor region 3 and the second hetero semiconductor region 12 are formed of a silicon material. Therefore, an energy barrier difference ΔEc of each of them from the drain region 2 formed of silicon carbide comes to be substantially equal. However, the N⁻type hetero semiconductor region 3 and the P⁻type second hetero semiconductor region 12 have a difference in Fermi energy shown by energy from a conduction band to Fermi level. Therefore, a width of a depletion layer extended from the junction interface of the drain region 2 comes to be different. That is, the width of the depletion layer extended from the junction interface with the second hetero semiconductor region 12 is larger than the width of the depletion layer expanded from the junction interface with the hetero semiconductor region 3. Therefore, higher performance of shielding can be obtained, that is, leakage current can be reduced. Further, when, for example, the impurity concentration of the second hetero semiconductor region 12 is provided to be higher than that of the hetero semiconductor region 3, the depletion layer generated by built-in electric field of P-N diode formed of the second hetero semiconductor region 12 and the hetero semiconductor region 3 extends to the hetero semiconductor region 3 side. Therefore, the leakage current in the hetero junction between the hetero semiconductor region 3 and the drain region can be further reduced.

Further, in this structure, if the hetero semiconductor region 3 is designed to have a width with which the gate electric field reaches from the gate electrode 5, the shielding performance of the semiconductor device can be further increased when, for example, the gate electrode 5 is provided to be a negative potential, and a revere region is formed in, for example, an entire region of the hetero semiconductor region 3.

Figure 7:
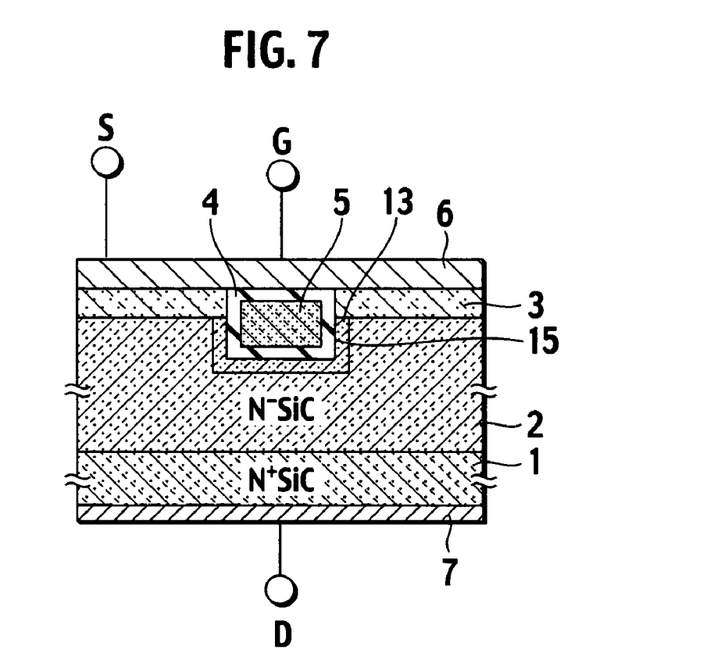
FIG. 7 is a cross sectional diagram showing a structure that is different from FIG. 1 in that N⁺ type conducting region 13 having higher concentration than that of a drain region 2 is formed.

(Structure of FIG. 7)

FIG. 7 is such that an N⁺ type conducting region 13 having higher concentration than that of a drain region 2 is formed in a predetermined portion between a gate insulating film 4 and the drain region 2 in the structure of FIG. 1. The description of a manufacturing method thereof will be given below as one example.

For example, in the state shown in FIG. 2D, the doping of phosphorus is carried out in the atmosphere of, for example, $POCl_3$ with a higher temperature, the phosphorus is introduced onto the surface of silicon carbide so that an N⁺ type conducting region 13 is formed. It should be noted that introduction of impurity with solid phase diffusion, or a method of introducing impurity with, for example, ionic implantation may be used.

With this structure, in a conducting state, an energy barrier of a hetero junction between the hetero semiconductor region 3 and the conducting region 13 are relieved, and majority carrier comes to easily flow from the hetero semiconductor region 3 to the drain region 2 through the conducting region 13. In addition, a higher conducting characteristic can be obtained and on resistance can be further reduced.

Figure 8:
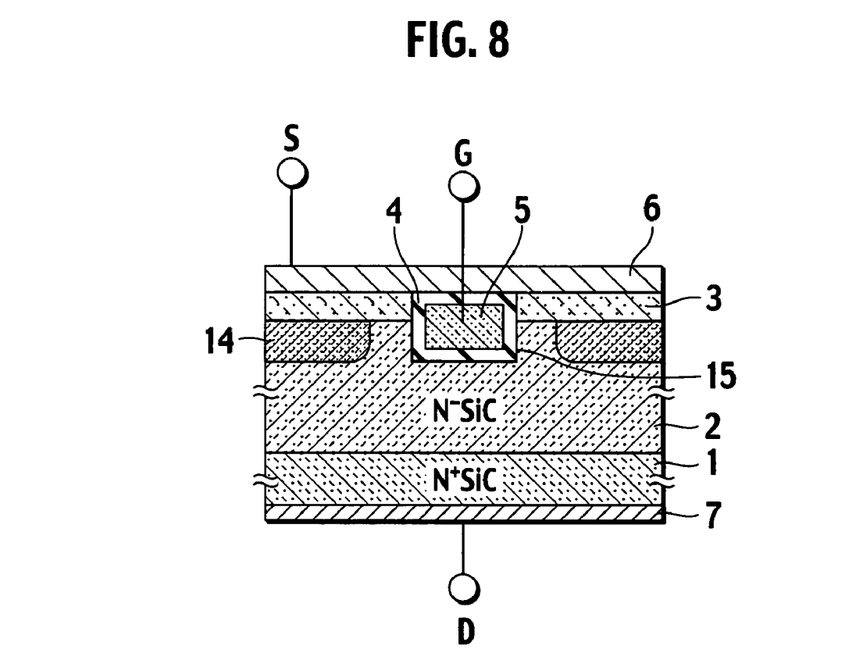
FIG. 8 is a cross sectional diagram showing a structure, in addition to the structure of FIG. 1, an electric field relaxation region 14 is formed on a surface of a drain region 2.

(Structure of FIG. 8)

A structure of FIG. 8 is such that, in addition to the structure of FIG. 1, an electric field relaxation region 14 is formed on a surface of a drain region 2 so as to adjoin the hetero semiconductor region 3 and space apart a predetermined distance from a portion in which a gate electrode 5 and a hetero semiconductor region 3 are opposed each other. The description will be given below as one example.

In FIG. 2A having the structure of FIG. 1, for example, before the hetero semiconductor layer 30 is formed, the P type electric field relaxation region 14 is formed by the ionic implantation of aluminum ion or boron ion by using the mask layer having a predetermined opening as a mask. It should be noted that it may be formed by solid phase diffusion. The subsequent processes are the same with that of manufacturing the structure of FIG. 1.

With this structure, in a conducting state, the energy barrier of the hetero junction between the hetero semiconductor region 3 and the drain region 2 is relieved, and a higher conducting characteristic can be obtained. That is, on resistance further comes to be small, accordingly the conducting performance is improved.

In addition, in a shielding state, a depletion layer spreads between the electric filed relaxation region 14 and the drain region 2 depending on a drain potential. That is, the leakage current is further reduced and the shielding performance is improved since a drain potential applied to the hetero junction between the hetero semiconductor region 3 and the drain region 2 is relieved by the electric field relaxation region 14.

Figure 9:
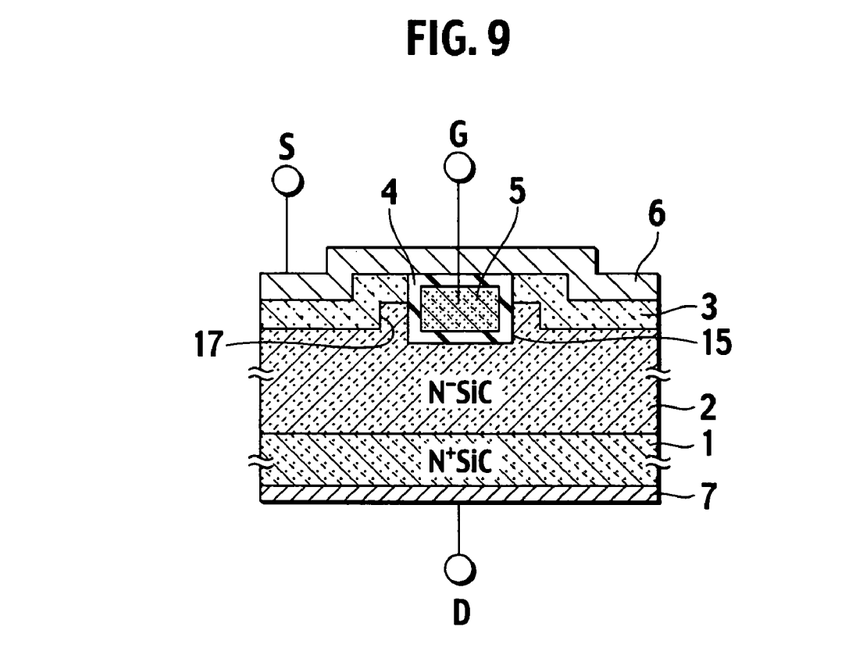
FIG. 9 is a cross sectional diagram showing a modified example of the structure of FIG. 1.

(Structure of FIG. 9)

A structure of FIG. 9 is a modified example of the structure of FIG. 1, and a trench 17 is formed in the drain region 2 before the antioxidant film 8 is formed in FIG. 2A. After that, the hetero semiconductor layer 30 is formed. The sequent processes are the same with that of manufacturing the structure of FIG. 1. With this structure, the leakage current in the hetero semiconductor region 3 can be further reduced than the structure of FIG. 1.

As described above, using the basic processes of the present invention, various structures as shown in FIGS. 6 to 9 can be formed.

As all the structures in the preferred embodiments are described so far taking, a semiconductor device using silicon carbide as a substrate material is described as one example, the material for the substrate may be other semiconductor materials such as silicon, silicon germanium, gallium nitride, and diamond. In addition, in all the structures, silicon carbide whose polytype is 4H is used as one example for the description, but it may be other polytype such as 6H and 3C. Moreover, in all the structures, a transistor having so-called a vertical structure in which a drain electrode 7 and a source electrode 6 are disposed to oppose each other with the drain region 2 sandwiched therebetween so that drain current flow occurs vertically, is used for the description, but a transistor having so-called a horizontal structure in which, for example, a drain electrode 7 and a source electrode 6 are disposed to be flush with each other so that drain current flow occurs horizontally, may be used.

Furthermore, the description is given by using polycrystal as a material used for a hetero semiconductor region 3 or a second hetero semiconductor region 12 as one example, but the material can be any material as long as it forms a hetero junction with silicon carbide. Still furthermore, as one example, the description is given by using an $N^-$type silicon carbide as a drain region 2 and an $N^-$type polycrystalline silicon as a hetero semiconductor region 3, but it may be any combination of $N^-$type silicon carbide and $P^-$type polycrystalline silicon, $P^-$type silicon carbide and $P^-$type polycrystalline silicon, and $P^-$type silicon carbide and $N^-$type polycrystalline silicon.

It is obvious that modifications may be made as long as it does not depart from the major point and the scope of the present invention.

It should be noted that a mask layer used for forming a predetermined trench on a main surface side of a semiconductor body according to claims of the present invention corresponds to a mask layer 9 and an antioxidant film 8 in the preferred embodiments.

The entire content of a Patent Application No. TOKUGAN 2004-281639 with a filing date of Sep. 28, 2004 in Japan is hereby incorporated by reference.

Although the invention has been described above by reference to certain embodiments of the invention, the invention is not limited to the embodiments described above. Modifications and variations of the embodiments described above will occur to those skilled in the art, in light of the teachings. The scope of the invention is defined with reference to the following claims.

What is claimed is:

1. A method of manufacturing a semiconductor device, which includes a semiconductor body of a first conductivity type; a hetero semiconductor region adjacent to one main surface of the semiconductor body and having a band gap different from that of the semiconductor body; a gate electrode formed in a junction portion between the hetero semiconductor region and the semiconductor body through a gate insulating film; a source electrode connected to the hetero semiconductor region; and a drain electrode ohmic-connected to the semiconductor body, the method comprises:

a first process of forming a predetermined trench by using a mask layer having a predetermined opening on one main surface side of the semiconductor body;

a second process of forming the gate insulating film adjacent to at least a side wall of the trench;

a third process of forming the gate electrode adjacent to the gate insulating film;

a fourth process of forming a hetero semiconductor layer on the semiconductor body and the gate electrode through an interlayer insulating film; and a fifth process of forming the hetero semiconductor region by patterning the hetero semiconductor layer.

2. The method of manufacturing the semiconductor device according to claim 1, wherein the gate insulating film includes at least a thermal oxide film formed by thermal oxidation.

3. A method of manufacturing a semiconductor device, which includes a semiconductor body of a first conductivity type; a hetero semiconductor region adjacent to one main surface of the semiconductor body and having a band gap different from that of the semiconductor body; a gate electrode formed in a junction portion between the hetero semiconductor region and the semiconductor body through a gate insulating film; a source electrode connected to the hetero semiconductor region; and a drain electrode ohmic-connected to the semiconductor body, the method comprises:

a first process of forming a predetermined trench by using a mask layer having a predetermined opening on one main surface side of the semiconductor body;

a second process of forming a buried region adjacent to at least a side wall of the trench and so as to extend from the trench;

a third process of forming a hetero semiconductor layer so as to adjoin the semiconductor body and the buried region; and a fourth process of forming the hetero semiconductor region by patterning the hetero semiconductor layer.

4. The method of manufacturing the semiconductor device according to claim 3, wherein the hetero semiconductor region is formed by etching back the hetero semiconductor layer in the fourth process.

5. The method of manufacturing the semiconductor device according to claim 3, wherein the hetero semiconductor region is formed by carrying out Chemical Mechanical Polishing for the hetero semiconductor layer.

6. The method of manufacturing the semiconductor device according to claim 3, wherein the buried region is formed of a material which is removable after the third process.

7. The method of manufacturing the semiconductor device according to claim 3, wherein a process of forming the gate insulating film so as to adjoin a hetero junction interface between the hetero semiconductor region and the semiconductor body is included after the fourth process.

8. The method of manufacturing the semiconductor device according to claim 3, wherein a process of sacrificial oxidation is included between the first process and the second process.

9. The method of manufacturing the semiconductor device according to claim 3, wherein the semiconductor body is formed of silicon carbide.

10. The method of manufacturing the semiconductor device according to claim 9, wherein the mask layer is formed of a material having an approximate value to a thermal oxidation rate of silicon carbide.

11. The method of manufacturing the semiconductor device according to claim 3, wherein the hetero semiconductor region is formed of at least one of single crystalline silicon, polycrystalline silicon, and amorphous silicon.

* * * * *